(12) United States Patent
Vargo et al.

(10) Patent No.: US 7,838,322 B1
(45) Date of Patent: Nov. 23, 2010

(54) METHOD OF ENHANCING AN ETCH SYSTEM

(75) Inventors: Stephen Vargo, Arcadia, CA (US); Roman C. Gutierrez, Arcadia, CA (US)

(73) Assignee: Tessera MEMS Technologies, Inc., Arcadia, CA (US)

( * ) Notice: Subject to any disclaimer, the term of this patent is extended or adjusted under 35 U.S.C. 154(b) by 1062 days.

(21) Appl. No.: 11/365,047

(22) Filed: Feb. 28, 2006

Related U.S. Application Data (63) Continuation-in-part of application No. 11/361,608, filed on Feb. 24, 2006, now Pat. No. 7,813,634.

(60) Provisional application No. 60/657,261, filed on Feb. 28, 2005.

(51) Int. Cl.
*H01L 21/00* (2006.01)
*H01L 31/058* (2006.01)

(52) U.S. Cl. .................. 438/53; 438/706; 257/415; 257/E21.32; 257/E21.613

(58) Field of Classification Search .......... None
See application file for complete search history.

(56) References Cited

U.S. PATENT DOCUMENTS

| | | | |
|---|---|---|---|
| 6,060,336 A * | 5/2000 | Wan | 438/50 |
| 6,159,385 A * | 12/2000 | Yao et al. | 216/2 |
| 6,617,657 B1 * | 9/2003 | Yao et al. | 257/415 |
| 6,914,635 B2 | 7/2005 | Ostergard | |
| 7,435,612 B2 * | 10/2008 | Xiao et al. | 438/50 |
| 7,556,775 B2 * | 7/2009 | McGill et al. | 422/88 |
| 2004/0094086 A1 * | 5/2004 | Shimaoka et al. | 117/84 |
| 2006/0113594 A1 * | 6/2006 | Sakurada et al. | 257/347 |

OTHER PUBLICATIONS

Akihiro Koga et al. "Electrostatic Linear Microactuator Mechanism for Focusing a CCD Camera", Journal of Lightwave Tech.,vol. 17, No. 1, Jan. 1999, pp. 43-47.
Won I. Jang et al. "Fabrication of MEMS Devices by Using Anhydrous HF Gas-Phase Etching with Alcoholic Vapor", IOP Publishing 2002, pp. 297-306.

* cited by examiner

*Primary Examiner*—Alonzo Chambliss
(74) *Attorney, Agent, or Firm*—Haynes and Boone, LLP (57) ABSTRACT

Systems and techniques for enhanced etch processes. For example, a substrate may be received in an etch chamber, where the substrate comprises a handle layer, a bonding layer in communication with the handle layer, and a device layer in communication with the bonding layer. The device layer may comprise a device layer patterned therein and having a bottom surface, where the bottom surface of the device is attached to the bonding layer. The bonding layer may comprise an oxide annealed at relatively low temperature. A dry etch process may be performed to release the bottom surface of the device from the bonding layer.

16 Claims, 5 Drawing Sheets

METHOD OF ENHANCING AN ETCH SYSTEM

CROSS-REFERENCE TO RELATED APPLICATIONS

This application claims the benefit of U.S. Provisional Patent Application No. 60/657,261 filed on Feb. 28, 2005 entitled "Autofocus Camera" which is incorporated herein by reference.

In addition, this application is a Continuation-In-Part application of U.S. patent application Ser. No. 11/361,608 filed on Feb. 24, 2006 now U.S. Pat. No. 7,813,634 entitled "Autofocus Camera", which is incorporated herein by reference.

BACKGROUND

1. Field of Invention

This invention generally relates to fabrication of devices such as micro-electromechanical system (MEMS) devices.

2. Related Art

Process development, control, and monitoring are increasingly important as the dimensions of electronic and micro-electromechanical system (MEMS) devices decrease.

For example, some MEMS devices require accurate, high aspect ratio etch processes so that the resulting structures meet design tolerances. Although many techniques developed for use in the fabrication of electronic devices may be used in fabricating MEMS devices, they may fall short in some circumstances.

For example, although integrated circuitry may be incredibly complex, the physical boundaries of the chips themselves are relatively simple. In the manufacture of integrated circuits (ICs), a single substrate (e.g., semiconductor wafer) may be processed to form a number of ICs. The integrated circuits may then be separated into generally rectangular dice, to be packaged and sold.

By contrast, the physical boundaries of MEMS device structures may be quite complex. Therefore, they present some different challenges than those encountered in the manufacture of electronic devices.

Figure 1A:
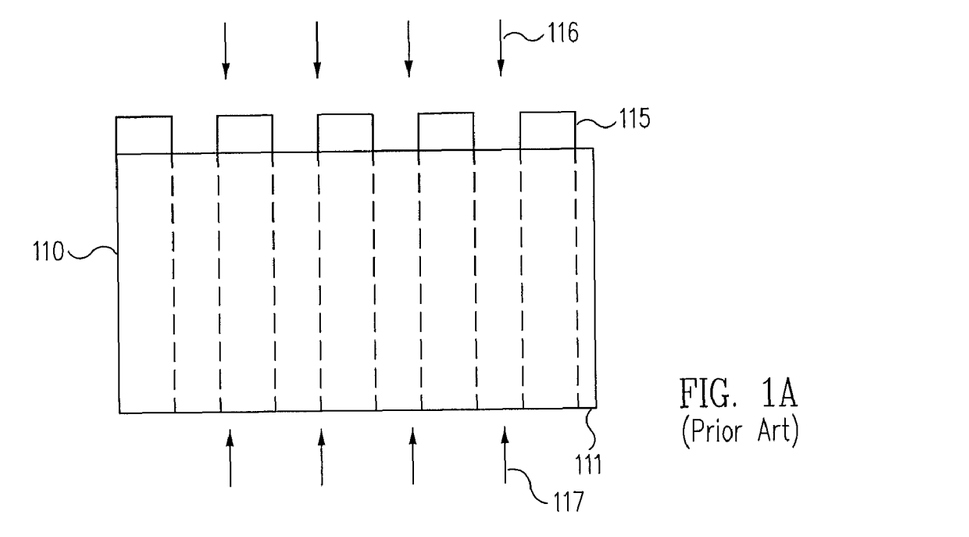
FIG. 1A is a schematic illustration of an etch process according to the prior art.

One example of a fabrication process for a MEMS device is shown in FIG. 1A. A 300 micron thick silicon wafer 110 is etched using a photoresist pattern 115 to form the desired device structure. In the example shown, a deep reactive ion etch (DRIE) with a suitable silicon etchant 116 is performed on the wafer. For this etch, the aspect ratio of the etch (the ratio of the depth to the width) can be quite high.

However, the example shown in FIG. 1A has a number of shortcomings from a processing standpoint. Since wafer 110 is etched completely through the wafer, it becomes quite fragile when the etch nears completion. Additionally, DRIE process equipment generally supplies a coolant material 117 to the back side 111 of wafer 110 in order to effectively cool the wafer and obtain acceptable photoresist selectivity values (without cooling, the photoresist can be rapidly removed from the wafer). Once wafer 110 is perforated, the action of coolant 117 becomes ineffective, especially on narrow resultant features. The resulting wafer heating may cause the etch process to deviate from expected results towards the end of the etch. Additionally, once wafer 110 is perforated, the pressure in the etch chamber can rapidly increase due to coolant supply pressures, which may cause damage to the wafer and/or etch equipment.

Figure 1B:
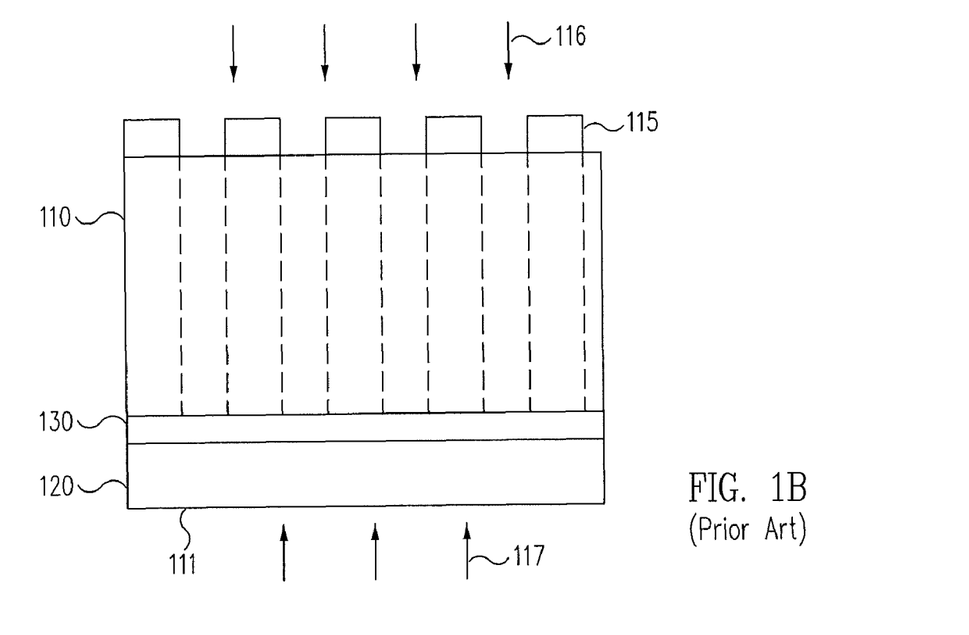
FIG. 1B is a schematic illustration of another etch process according to the prior art.

In order to mitigate these problems, a different process is generally used to manufacture MEMS devices requiring through wafer DRIE processing. FIG. 1B illustrates an example of this process. Rather than using a silicon wafer alone, the process in FIG. 1B uses a silicon wafer 110 attached to a carrier 120 using a bonding layer 130 of an adhesive material such as photoresist or wax.

As in the example of FIG. 1A, devices may be formed by etching structures defined by photoresist pattern 115, using an appropriate silicon etchant 116 in a DRIE process. Coolant 117 is applied to the backside 111 of carrier 120. Once the etch process is complete, the devices need to be released from bonding layer 130. This generally requires a labor-intensive cleaning process.

The process of FIG. 1B also has a number of drawbacks. First, the adhesive used to bond silicon wafer 110 to carrier 120 is generally a poor thermal conductor. Thus, heat from the etch process is not removed efficiently, and the temperature of etched wafer 110 increases as the etch progresses. This can degrade the quality of the etch process and comprise the resulting structure, so that the desired geometry is not obtained (particularly at the bottom of the etched structure formed near the completion of the etch process). Additionally, as noted above, the cleaning process to release structures from bonding layer 130 is labor-intensive, which increases both production time and cost.

In another example, a silicon on insulator (SOI) wafer may be used rather than a silicon wafer bonded to a carrier using adhesive. An SOI wafer has a silicon handle layer, an insulating (oxide) bonding layer, which is referred to as the buried oxide (BOX) layer, and a silicon device layer. Generally, SOI wafers are manufactured with great care, and good quality bonds on large sized wafers are common. The use of an SOI wafer provides a better thermal conduction path during the DRIE etch process (resulting in better conformance of the etched structure to the desired geometry). However, the structures are generally released using a wet etch process that etches the BOX layer. Multiple rinse processes must be performed to remove the liquid etchant (which usually contains hydrofluoric acid or HF) from the structures. The use of a wet etch/rinse process can result in stiction: that is, when the structures dry they tend to stick to each other or the handle wafer. Damage to structures caused by stiction increases the manufacturing costs.

SUMMARY

In general, in one aspect a method comprises receiving a substrate in an etch chamber. The substrate comprises a handle layer, a bonding layer in communication with the handle layer, and a device layer in communication with the bonding layer. The device layer comprises a plurality of device patterned therein and each having a bottom surface. The bottom surfaces of the devices are attached to the bonding layer. The method may further comprise releasing the bottom surface of the device from the bonding layer using a dry etch process, so that the plurality of devices are separated from the substrate (singulated). The dry etch process may comprise introducing an etchant comprising hydrofluoric acid into the etch chamber. The etchant may further comprise nitrogen carrier gas and anhydrous alcohol vapor. The method may further comprise transferring the device using an automated pick and place system subsequent to releasing the bottom surface of the device.

The substrate may comprise a silicon on insulator wafer. The handle layer may comprise an insulating layer, the device layer may comprise a silicon layer, and the bonding layer may comprise a buried oxide layer. The silicon on insulator wafer comprises a wafer formed by bonding the insulating layer having an oxide thereon to the device layer having an oxide thereon. The buried oxide layer may comprise an oxide grown at a temperature in the range from 800° C. to 900° C. The buried oxide layer may comprise an annealed buried oxide layer with an anneal temperature of between about 800° C. and about 1000° C.

In general, in another aspect, an etch system may comprise an etch chamber and a substrate holder positioned in the etch chamber and configured to position in an etch plane substrate. The substrate comprises a handle layer, a bonding layer in communication with the handle layer, and a device layer in communication with the bonding layer. The device layer comprises a plurality of devices patterned therein and each having a bottom surface, the bottom surface of the device attached to the bonding layer. The system further comprises an etch gas inlet configured to receive etch gases into the etch chamber. The etch system is configured to etch the bottom surface of the devices so that the devices are separated from the substrate.

These and other features and advantages of the present invention will be more readily apparent from the detailed description of the exemplary implementations set forth below taken in conjunction with the accompanying drawings.

BRIEF DESCRIPTION OF THE DRAWINGS

Like reference symbols in the various drawings indicate like elements.

DETAILED DESCRIPTION

Systems and techniques for an enhanced DRIE and associated release process are described. The enhanced DRIE process is very well controlled, and allows high aspect ratio defined features to keep their fine shape through completion of the etch on SOI wafers. The usage of an SOI wafer also allow the fabrication of thin and fragile devices, since the majority of wafer processing is performed with the device layer bonded to the handle layer. It is this handle layer that provides rigidity in wafer processing so that thin device layers can be processed without breaking. The systems and techniques may also provide for infrared detection of the etch front for the release etch, either in- or ex-situ.

Figure 2A:
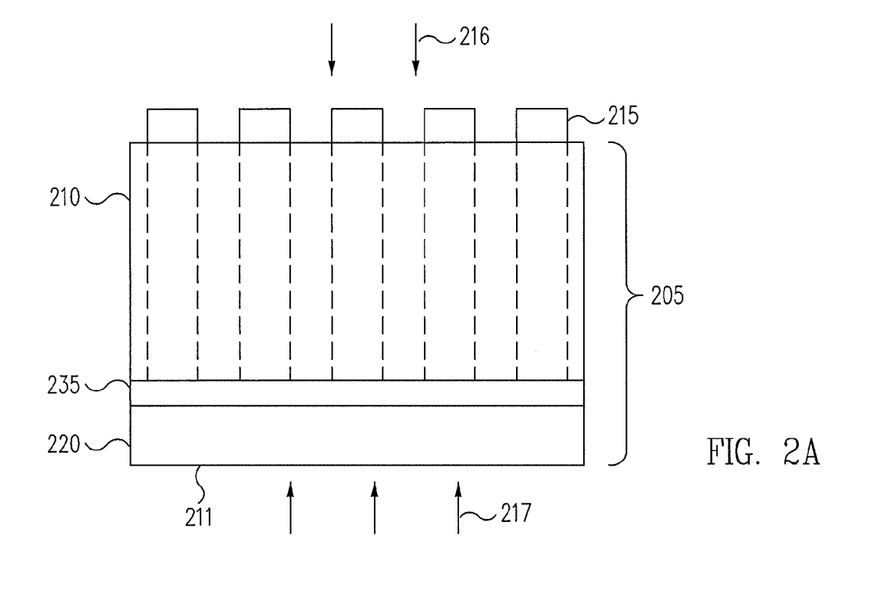
FIGS. 2A and 2B are a schematic illustration of an etch process, according to some embodiments.

FIG. 2A shows a schematic side view of an etch process that may be used to fabricate structures for MEMS devices (for example), according to some embodiments. An SOI wafer 205 includes a silicon handle layer 220 and a silicon device layer 210 bonded by a buried oxide (BOX) bonding layer 235. The etch process may be performed using systems such as the Primaxx MEMS-CET system available from Primaxx, Inc.

A photoresist layer 215 is deposited on device layer 210, then patterned according to the desired device structure. A DRIE etch is performed using a silicon etchant 216, to form the structure geometries. During the DRIE etch, coolant 217 is incident on backside 211 of SOI wafer 205. Because the thermal conduction of the SOI wafer used is higher than that of a silicon wafer bonded to a carrier using adhesive, the temperature of device layer 210 is controlled to a much greater extent. As a result, the DRIE forms structures that conform more closely to desired geometries.

Figure 2B:
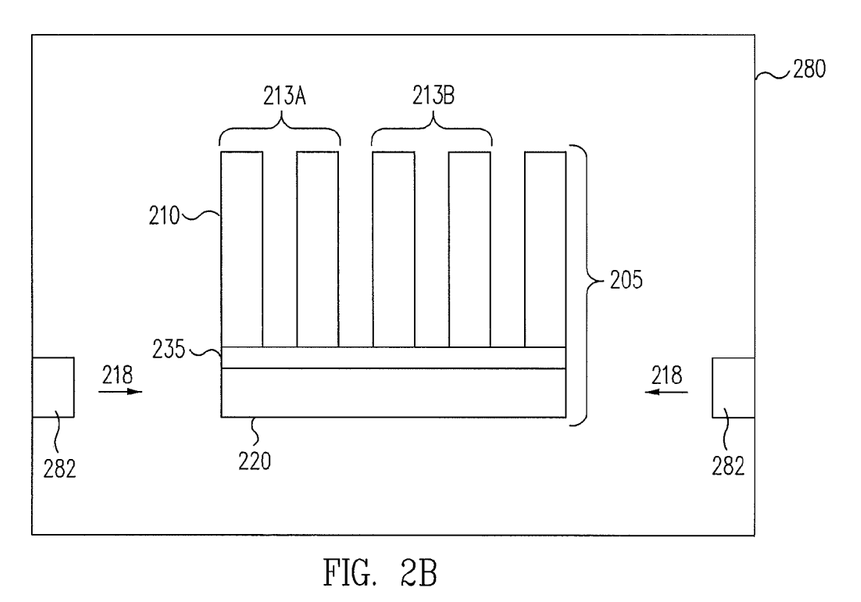

After completion of the DRIE etch, the structures remain bonded to handle layer 220 by a BOX layer 235. As noted above, a wet etch step using hydrofluoric acid (HF) is commonly used to release structures from SOI wafers. By contrast, in embodiments of the current invention, a dry etch step is used. FIG. 2B is a schematic illustration of the release process for structures formed using the DRIE process illustrated in FIG. 2A.

Figure 2C:
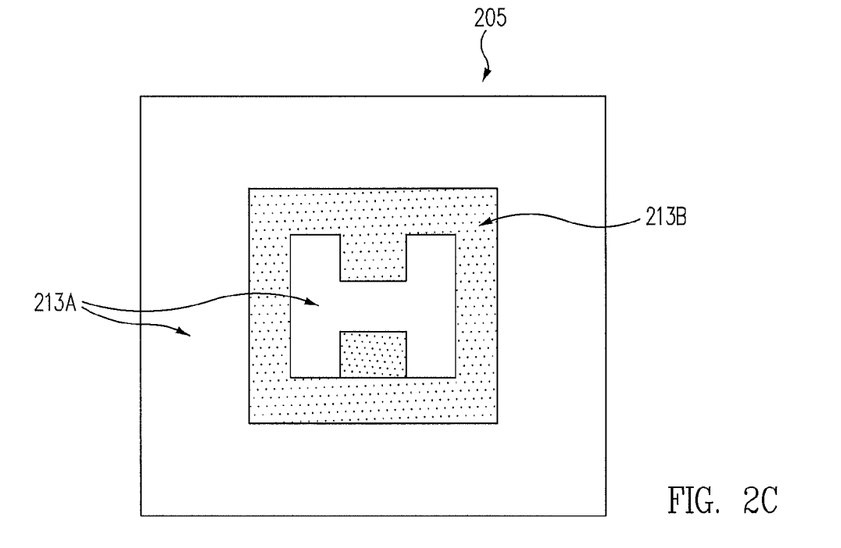
FIG. 2C is a top view of two devices to be released using the etch process of FIGS. 2A and 2B.

Processed SOI wafer 205 is received in a release etch chamber 280. Processed SOI wafer 205 includes one or more structures such as MEMS structures 213A and 213B patterned in device layer 210. The one or more structures are attached to BOX bonding layer 235 at the bottom surface of the structures. FIG. 2C is a top view of processed SOI wafer 205 including exemplary structures 213A and 213B.

After wafer 205 is positioned in a release etch chamber 280, configured to perform a dry oxide etch step, the pressure is reduced, and an etch gas is introduced into chamber 280 via one or more inlets 282. The etch gas includes an etchant 218, which may be gaseous HF. The etch gas usually includes a carrier gas such as nitrogen, and/or a solvent material such as anhydrous alcohol vapor. The mixed gases are transmitted into etch chamber 280. In some embodiments, the gases may be transmitted in a direction that is generally parallel to an etch plane of the substrate (a plane in which the substrate is positioned in chamber 280). For example, in some embodiments the etch gas is introduced through one or more inlets 282 in the side of chamber 280, so that average velocity of the gas molecules is generally parallel to the etch plane of the substrate. In other embodiments, the gas molecules may be directed more precisely; for example, using one or more nozzles or other gas-directing apparatus.

The etch process removes the buried oxide bonding layer 235 so that devices 213A and 213B are undercut and released from SOI wafer 205. The etch process continues until each of the devices singulated by DRIE etching on wafer 205 is released. The total process time in the dry etch process is dictated by the amount of oxide needed to be removed so that bound devices are oxide free.

Since a water rinsing cycle is not required, stiction problems that may occur using some existing wet processes are greatly mitigated. Therefore, devices 213A and 213B can be removed from their post-release positions in the dry etch system using a highly efficient and low cost automated pick and place machine. The automated pick and place machine extracts the devices and places them into one or more appropriate carriers in a very efficient process. The pick and place equipment uses robotic transfer techniques that utilize precise position and vacuum pickup hardware and software programs. The wafer may be transferred to another system for the pick and place die transfer step.

As noted above, an SOI wafer 205 is used for the embodiments described above. However, in some embodiments, the SOI wafer 205 is configured specifically to be used in the above techniques, rather than being a standard SOI wafer typically used in electronic applications.

For example, the thickness of device layer 210 is tailored to the particular structures being fabricated. In one example, the thickness of device layer 210 may be about 300 microns to fabricate devices of about 300 microns or less. Of course, the thickness need not be the exact thickness of the devices being fabricated.

The BOX bonding layer 235 may also be fabricated for the particular techniques described above. For a typical SOI wafer, a buried oxide bonding layer is annealed at about 1100 degrees C. or higher, to obtain a high strength bond between the handle layer and device layer 210. By contrast, the techniques described above may use an SOI wafer 205, including bonding layer 235 annealed at much lower annealing temperatures, to obtain weak strength bonds between device layer 210 and handle layers. Successful SOI wafer bonding has been demonstrated between about 800° C. and about 1200° C. In some embodiments, bonding layer 235 may be annealed at about 850° C. (e.g., between 830° C. and 870° C.). Note that the annealing temperature referred to herein is the highest temperature of the structure over the time during which the anneal is performed, measured from a time after the SOI wafer has been heated to an anneal temperature until the post-anneal cooling process begins.

The thickness of BOX bonding layer 235 may also be selected for implementing the techniques above, although the thickness of BOX boding layer 235 may not be important in terms of its affect on etch characteristics. In some embodiments, the thickness may be about half a micron, or between about 0.25 microns and about 2 microns.

However, the bonding interface of BOX bonding layer 235 may have a major affect on bond strength (and thus be important for the release process). In one example, a wafer which needs 0.5 um oxide as the BOX could be comprised of 0.25 um device layer oxide and 0.25 um handle layer oxide. We have observed much faster etch rate in the release step with this type of oxide-to-oxide interface instead of oxide-to-silicon interface. Therefore, in some embodiments, SOI wafer 205 may be formed by bonding a device layer having a device layer oxide of a first oxide thickness to a handle layer having a handle layer oxide of a second thickness, where the first thickness may be substantially the same as or may be substantially different than the second thickness.

Another issue is that the dry etch process is sensitive to the growth conditions of the BOX layer. Oxides grown at temperatures lower than standard 1050° C. conditions (850° C. growth conditions were investigated) etch more quickly. Therefore, in some embodiments, SOI wafer 205 may be formed using oxides grown at temperatures between about 800° C. and about 900° C., and in some embodiments about 800° C. and about 1000° C. or 1050° C.

The thickness of handle layer 220 may be about 500 to 800 microns with generally thicker handles needed as the wafer diameter increases to ensure safer handling. The thickness of handle layer 220 may be large enough to support devices 213A and 213B after release and during transport to a location to be removed and placed in a carrier (in implementations where the devices are removed in a location separate from chamber 280). However, the thickness of the handle layers 220 may affect wafer cooling during the DRIE process. Therefore, a thickness of handle layer 220 may be selected to provide sufficient strength for coolant material 117 resistance without increasing its thermal resistance to a degree that would unduly affect the quality of the DRIE process. In 8 inch diameter wafers, 725 um thickness handle is a standard thickness wafer for the SOI wafer.

In addition to the enhanced DRIE and release processes described above, systems and techniques provided herein include a novel etch detection/metrology system and associated techniques.

As noted above, after MEMS structures are formed (e.g., using lithography and DRIE processes as described above), the structures are released from the substrate. The release may be a wet etch (according to existing techniques), or the dry etch described above. In either case, understanding and characterizing the etch process may be important for successful implementation.

For example, characterizing the dry etch process may allow the etch parameters and/or substrate SOI configuration to be selected to improve the etch rate and increase throughput. One factor that affects total etch rate is the etch rate in different parts of the wafer. If some areas on the SOI wafer etch more slowly than others, it takes longer to release the structures than if the etch rate were consistent across the entire wafer. Additionally, full etch characterization allows selection of an etch time that is sufficient to release the devices but not so long that it substantially increases processing time.

In some existing systems, the release etch (a wet etch) is pre-characterized as follows. First, a sample SOI device may be provided, and an etch performed for a particular time, with a particular set of etch parameters (e.g., temperature, HF concentration, etc.) At the end of the etch time, the sample may be cleaved (cut open to expose a portion of the etch front) and inspected using an inspection tool such as a scanning electron microscope (SEM). The SEM shows an etch profile after the particular time. The etch times and parameters may be varied, to determine etch parameters to obtain the desired results of the process.

The information may be used to improve the etch process, and the above process may be repeated until etch parameters that obtain a desired result are determined. However, this method is destructive, time-consuming, and costly. Further, the measurement only samples the portion of the structure exposed by the cleaving operation, so multiple cleaves and inspections are needed to get a complete understanding of the etch profile for a given process.

By contrast, the systems and techniques described herein allow for more complete etch characterization using infrared metrology. In some embodiments, the techniques may be used to inspect an etched structure during and/or after a release etch has been performed. FIGS. 3A to 3D show steps in a process to release a device on a device layer 210 included in an SOI wafer 205. SOI wafer 205 includes BOX bonding layer 235 and handle layer 220 (as shown in FIGS. 2A and 2B).

Figure 3A:
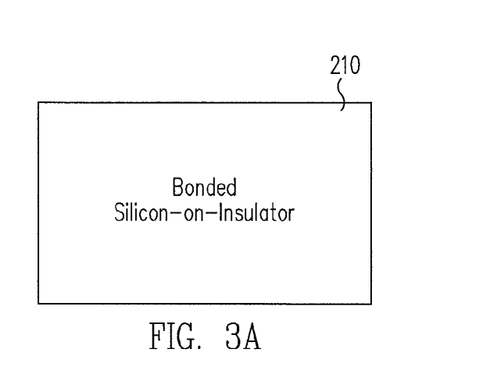
FIGS. 3A to 3D show steps in a process to release a device, according to some embodiments.
Figure 3B:
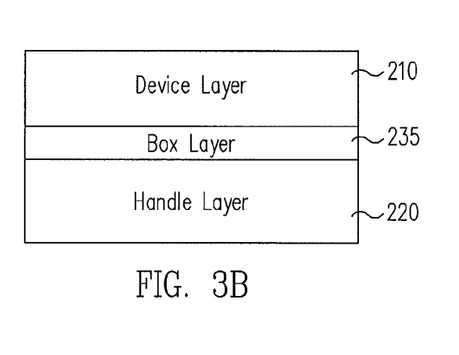

FIG. 3A show a top view of device layer 210 prior to the initiation of the etch release process. FIG. 3B shows a side view of device layer 210 and its relationship to BOX bonding layer 235 and handle layer 220.

Figure 3C:
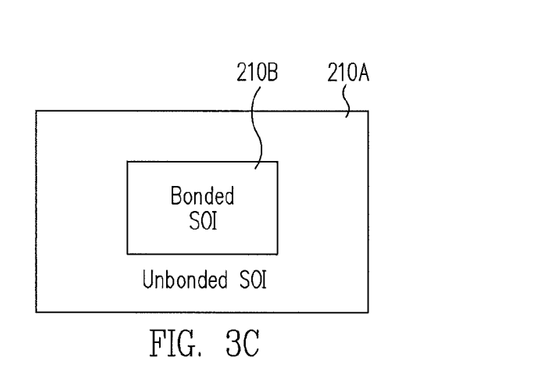
Figure 3D:
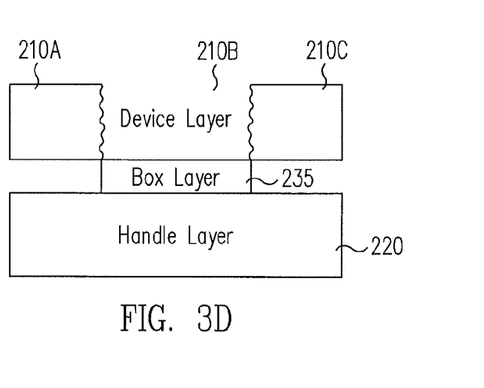

FIG. 3C shows a top view of device layer 210 at a time $T_1$ after the initiation of the release etch. Device layer 210 includes two regions: a first region 210A including device features that have been released from bonding layer 235, and a second region 210B including device features not yet released from bonding layer 235. FIG. 3D shows a side view of wafer 205 at time $T_1$, illustrating the etched bonding layer 235.

Figure 4:
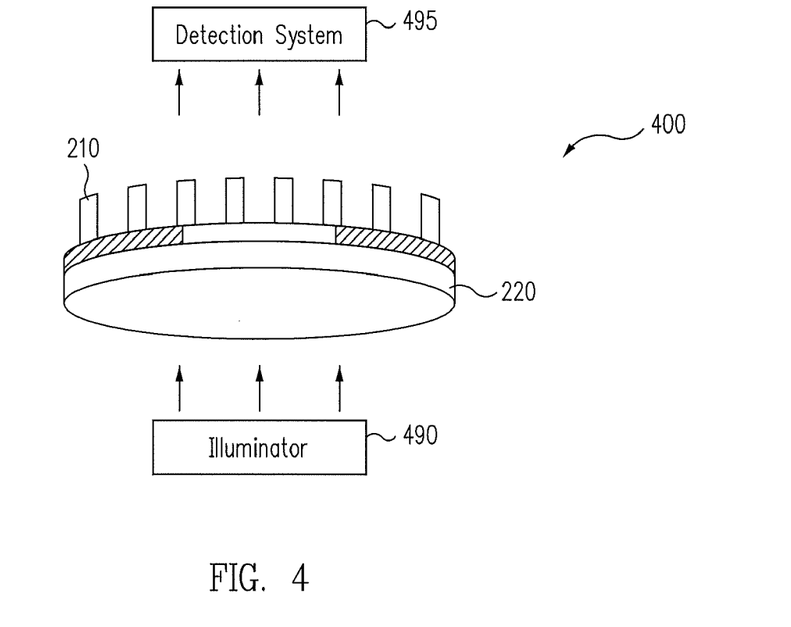
FIG. 4 illustrates a metrology system, according to some embodiments.

FIG. 4 shows an implementation of an infrared (IR) metrology system 400 that may be used to detect etch fronts such as those illustrated in FIGS. 3C and 3D. System 400 includes an infrared detection system 495 and an IR illuminator 490. Note that herein the term "infrared" refers to radiation having a wavelength in the range from about 0.9 microns to about 1.7 microns. Note that commercial IR and near IR camera systems, such as those provided by FLIR Systems, Inc., may be used in system 400.

Wafer 205 may be illuminated from the backside using radiation from illuminator 490. Because the IR radiation interacts differently with portions of wafer 205 where the bonding layer 235 has been etched than it does with portions of wafer 205 where bonding layer 235 has not been etched, detection system 495 generates information indicative of the location of the etch fronts.

In some embodiments, detection system 495 includes an IR camera, which includes an array of detection elements such as bolometers. Each detection element may generate a signal indicative of the IR radiation incident on the detection element. The information for each detection element may be used to generate information indicative of an image, which may be used to display an image of the etch front. The image may include a plurality of pixels, where each pixel displays an image part indicative of the IR radiation incident on an associated detection element of the IR camera. The information may also be evaluated to determine the position of the edge fronts, and to determine etch rates of different portions of wafer 205 (i.e., the information may be analyzed rather than or in addition to being displayed). The information may be used to determine an etch profile, using a calibrated coordinate system.

An infrared metrology system such as system 400 may provide a number of benefits. First, etch information is provided across the wafer 205. By contrast, existing cleave/SEM techniques provide etch information at only the cleaved location on the wafer. Second, the inspection can occur in a non-destructive manner. Because of these features, the current techniques provide valuable information not only about the etch process, but also about the SOI wafer itself.

As noted above, SOI wafers are fabricated by bonding a device layer to a handle layer using a binding layer such as a buried oxide layer. Because SOI wafers are more complex structures than single component wafers, the etch rate may differ more across the wafer. For example, in some portions of an SOI wafer, the device layer may be more strongly bonded to the handle layer than in other portions. In the strongly bonded portions, the etch rate may be slower. Therefore, the time to complete the release etch may be longer than optimal. Because these different etch rates can be discovered by detecting the etch fronts, the information can be used to improve the fabrication of SOI wafers and to reach more uniform etching processes.

System 400 may also enable more efficient production of devices such as MEMS devices. Because current methods for releasing devices require time-consuming post-etch processing, the wafers are generally over-etched to ensure that all devices are fully released. By characterizing the etch process more completely, the etch time can be reduced and production efficiency approved.

Etch front detection may be used in a number of different ways. First, it may be used to pre-characterize a release etch process (either existing wet etch or the enhanced release process described above), so that improved etch parameters and/or SOI substrate parameters can be developed. In order to pre-characterize the etch process, a sample wafer may be transmitted into a release etch chamber such as chamber 280 of FIG. 2B. A release etch having a set of etch parameters (e.g., etchant concentration, pressure, temperature, time, etc.) may be performed for a first time, and then the sample wafer may be transmitted to a detection module including a system such as system 400. The etch fronts may be detected, and used with other information to determine characteristics of the etch associated with the etch parameters. This process may be repeated until an etch time associated with a set of etch parameters to be used in production is determined.

IR metrology may also be performed in-situ. In one embodiment, elements of system 400 may be included in release etch chamber 280 of FIG. 2B. In such an embodiment, the etch may be monitored in real time (when elements of system 400 are positioned to illuminate wafer 205 during etching), or near real time (e.g., when elements of system 400 do not illuminate wafer 205 during etching but are brought into position at a time when the etch is not being performed).

Figure 5:
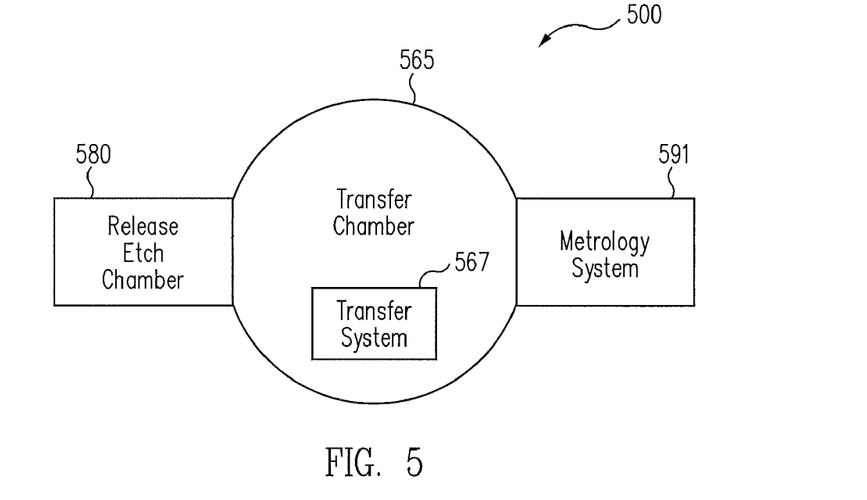
FIG. 5 illustrates an in-situ metrology system, according to some embodiments.

FIG. 5 shows another embodiment of a system 500 for in-situ IR metrology. Rather than performing metrology in the etch chamber itself, wafer 205 may be transferred from release etch chamber 280 to an infrared metrology station 591 via a transfer chamber 565. Transfer chamber 565 may include a transfer system 567 such as a robotic transfer system to move wafer 205 between etch chamber 580 and IR metrology station 591. In some embodiments, the waver 205 may be moved between elements of system 500 under vacuum (at a pressure less than atmospheric pressure). This may further enhance predictability and reproducibility.

Figure 6A:
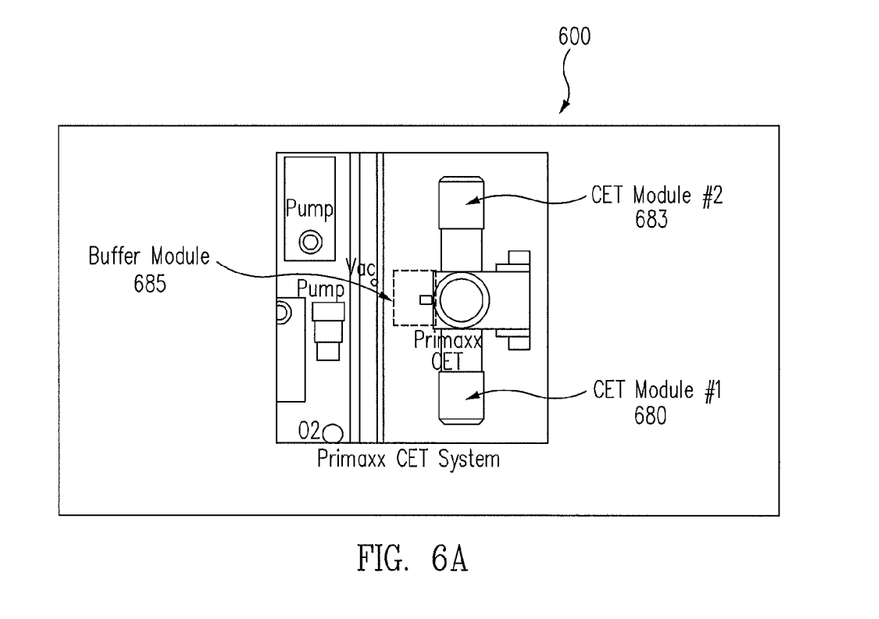
FIG. 6A illustrates another embodiment of an in-situ metrology system.

FIG. 6A shows another embodiment of a system 600 to perform in-situ IR metrology, using a Primaxx CET system. System 600 includes a first processing module 680 and a second processing module 683. First processing module 680 and/or second processing module 683 may be configured to perform a release etch using a dry etch process such as that described above. System 600 further comprises a buffer module 685. A wafer transfer system (not shown) is configured to transfer wafers among first processing module 680, second processing module 683, and buffer module 685. Buffer module 685 may be an aluminum chamber with acrylic windows, and may include mounting features to position one or more wafers (three wafers standard) in buffer module 685.

Figure 6B:
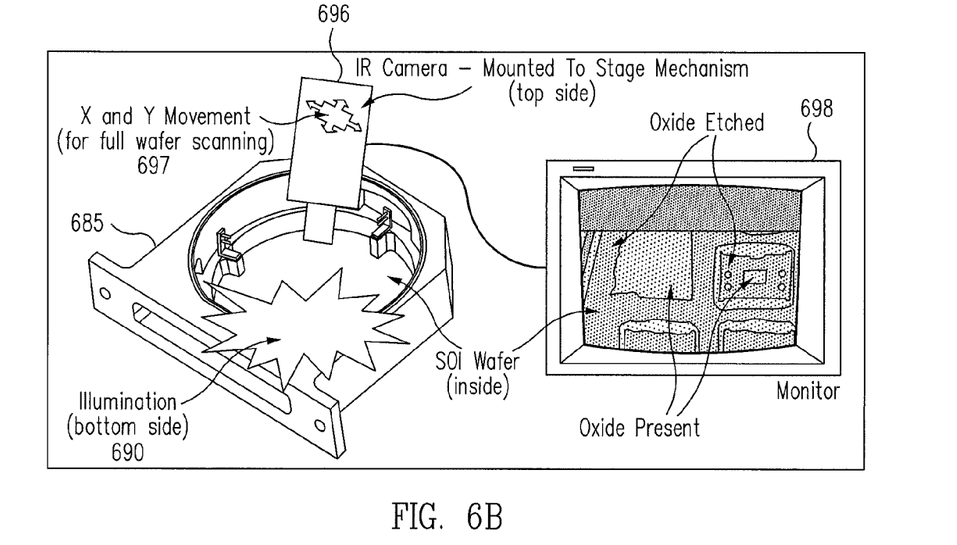
FIG. 6B is a perspective view of a buffer module for the in-situ metrology system of FIG. 6A.

FIG. 6B shows a perspective view of buffer module 685 with an IR detection system installed. Buffer module 685 includes an illuminator 690 that may be positioned on the bottom side of buffer module 685 to illuminate a wafer positioned in buffer module 685 from the back side. Buffer module 685 may further include an IR camera 696 to detect IR from the top side of a wafer positioned in buffer module 685. IR camera 696 may be positioned at the top side of buffer module 685; for example, and may be mounted to a stage mechanism 697 to provide X and Y movement to enable full wafer scanning. In some embodiments, at least part of camera 696 and/or illuminator 690 may be positioned outside buffer module 685, and the wafer may be illuminated and/or IR detected using the windows of buffer module 685. A display 698 may be provided to display information indicative of the status of an etch process. Display 698 may receive information from camera 696 and/or a computer (not shown).

The system of FIGS. 6A and 6B may be used as follows. A wafer to be etched may be received in system 600, and processed in first processing module 680 and/or second processing module 683. For example, a DRIE etch may be performed to form device structures on an SOI wafer, then a release etch may be performed to release the device structures from the wafer. The DRIE and release etch processes may be performed as described above. At the end of a projected etch completion time, the wafer may be removed from the processing module and positioned in buffer module 685. IR metrology may be performed while the wafer is positioned in buffer module 685 to determine whether the structures have been fully released. If they have not, the wafer may be returned to the processing module for further processing.

In another example, system 600 may be used to characterize the etch process, as described above. That is, the wafer may be etched for a time, then transferred to buffer module 685 for IR metrology, then returned to the processing module for further processing. As a result, the etch progress as a function of time may be determined, allowing the etch process to be more fully understood and optimized.

In-situ IR metrology may provide the benefit that the wafer need not be exposed to atmosphere between the etch and measurement steps. Since environmental exposure may change the etch characteristics of the wafer, in-situ metrology may provide for more accurate etch characterization. Although real-time metrology may be more complex to implement, it provides more complete information about the etch process than other embodiments.

In implementations, the above described techniques and their variations may be implemented at least partially as computer software instructions. Such instructions may be stored on one or more machine-readable storage media or devices and are executed by, e.g., one or more computer processors, or cause the machine to perform the described functions and operations.

A number of implementations have been described. Although only a few implementations have been disclosed in detail above, other modifications are possible, and this disclosure is intended to cover all such modifications, and most particularly, any modification which might be predictable to a person having ordinary skill in the art. For example, although SOI wafers are described, other multi-layer wafers including a handle layer, bonding layer, and device layer may be used.

Also, only those claims which use the word "means" are intended to be interpreted under 35 USC 112, sixth paragraph. Moreover, no limitations from the specification are intended to be read into any claims, unless those limitations are expressly included in the claims. Accordingly, other embodiments are within the scope of the following claims.

What is claimed is:

1. A method, comprising:
    receiving a substrate in an etch chamber, the substrate comprising a silicon on insulator (SOI) wafer, including a handle layer comprising an insulating layer, a bonding layer comprising a buried oxide layer in communication with the handle layer, and a device layer in communication with the bonding layer, the device layer comprising a silicon layer having one or more devices patterned therein, each device having a bottom surface attached to the bonding layer; and,
    separating each of the one or more devices from the substrate, wherein separating each of the one or more devices from the substrate comprises releasing the bottom surface of each of the devices from the bonding layer using a dry etch process.

2. The method of claim 1, further comprising transferring the devices using an automated pick and place system subsequent to releasing the bottom surface of each of the devices.

3. The method of claim 1, wherein releasing the bottom surface of each of the devices from the bonding layer using the dry etch process comprises introducing an etchant comprising hydrofluoric acid into the etch chamber.

4. The method of claim 1, wherein the silicon on insulator wafer comprises a wafer formed by bonding the insulating layer having an oxide thereon to the device layer having an oxide thereon.

5. The method of claim 1, wherein the buried oxide layer comprises an oxide grown at a temperature in the range from 800° C. to 1000° C.

6. The method of claim 1, wherein the buried oxide layer comprises an annealed buried oxide layer with an anneal temperature of between about 800° C. and about 1000° C.

7. A processing system comprising:
    means for receiving a substrate in an etch chamber, the substrate comprising a silicon on insulator (SOI) wafer, including a handle layer comprising an insulator layer, a bonding layer comprising a buried oxide layer in communication with the handle layer, and a device layer in communication with the bonding layer, the device layer comprising a silicon layer having one or more devices patterned therein, each device having a bottom surface attached to the bonding layer; and,
    means for releasing the bottom surface of each of the devices from the bonding layer using a dry etch process to separate each of the devices from the substrate.

8. The system of claim 7, further comprising means for automatically picking and placing the device subsequent to releasing the bottom surfaces of each of the devices from the bonding layer.

9. The system of claim 7, wherein the means for releasing the bottom surfaces of each of the devices from the bonding layer using the dry etch process comprises means for introducing an etchant comprising hydrofluoric acid into the etch chamber.

10. The system of claim 7, wherein the silicon on insulator wafer comprises a wafer formed by bonding the insulating layer having an oxide thereon to the device layer having an oxide thereon.

11. The system of claim 7, wherein the buried oxide layer comprises an oxide grown at a temperature in the range from 800° C. to 900° C.

12. The system of claim 7, wherein the buried oxide layer comprises an annealed buried oxide layer with an anneal temperature of between about 900° C. and about 1000° C.

13. An article comprising a machine-readable medium embodying information indicative of instructions that when performed by one or more machines result in operations comprising:
    receiving a substrate in an etch chamber, the substrate comprising a silicon on insulator (SOI) wafer, including a handle layer comprising an insulator layer, a bonding layer comprising a buried oxide layer in communication with the handle layer, and a device layer in communication with the bonding layer, the device layer comprising a silicon layer having one or more devices patterned therein, each device having a bottom surface attached to the bonding layer; and,
    separating the plurality of devices from the substrate, wherein separating the plurality of devices from the substrate comprises releasing the bottom surface of each of the one or more devices from the bonding layer using a dry etch process.

14. The article of claim 13, wherein the operations further comprise transferring the one or more devices using an automated pick and place system subsequent to releasing the bottom surface of each of the devices.

15. The article of claim 13, wherein releasing the bottom surface of each of the devices from the bonding layer using the dry etch process comprises introducing an etchant comprising hydrofluoric acid into the etch chamber.

16. The article of claim 13, wherein the operations further comprise positioning the substrate in an etching plane, and wherein releasing the bottom surface of each of the devices from the bonding layer using the dry etch process comprises transmitting one or more etchant materials toward the substrate in the etching plane.

* * * * *